United States Patent
Khlat

(10) Patent No.: US 12,537,510 B2
(45) Date of Patent: Jan. 27, 2026

(54) MULTI-PASSBAND FREQUENCY ACOUSTIC STRUCTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 140 days.

(21) Appl. No.: 18/337,125

(22) Filed: Jun. 19, 2023

(65) Prior Publication Data

US 2024/0014803 A1   Jan. 11, 2024

Related U.S. Application Data

(60) Provisional application No. 63/415,000, filed on Oct. 11, 2022, provisional application No. 63/358,945, filed on Jul. 7, 2022.

(51) Int. Cl.
*H03H 9/54*     (2006.01)
*H03H 9/205*    (2006.01)

(52) U.S. Cl.
CPC ............ *H03H 9/542* (2013.01); *H03H 9/205* (2013.01)

(58) Field of Classification Search
CPC .......... H03H 9/542; H03H 9/205; H03H 9/58; H03H 2009/02204; H03H 9/545;
(Continued)

(56) References Cited

U.S. PATENT DOCUMENTS 3,568,108 A   3/1971   Poirier et al.
4,924,195 A   5/1990   Gonda
(Continued)

FOREIGN PATENT DOCUMENTS

CN    107727125 A    2/2018
JP    3854212 B2     12/2006
(Continued)

OTHER PUBLICATIONS

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.
(Continued)

*Primary Examiner* — John W Poos
(74) *Attorney, Agent, or Firm* — Withrow & Terranova, P.L.L.C.

(57) ABSTRACT

A multi-passband frequency acoustic structure is provided. The multi-passband frequency acoustic structure includes an acoustic resonator structure configured to pass a signal to a signal output in a built-in series resonance frequency (a.k.a. built-in passband frequency). Notably, the built-in serial resonance frequency is typically fixed and determined by the mass and/or structure of the acoustic resonator structure. In embodiments disclosed herein, the multi-passband frequency acoustic structure further includes a tuning circuit, which can be tuned to bypass the acoustic resonator structure in a tunable serial resonance frequency (a.k.a. tunable passband frequency) to pass the signal directly to the signal output, or to forward the signal to the acoustic resonator structure outside the tunable serial resonance frequency (e.g., in the built-in serial resonance frequency). As such, the multi-passband frequency acoustic structure can operate with multiple serial resonance frequencies to thereby support multiple passband frequencies.

12 Claims, 8 Drawing Sheets

(58) Field of Classification Search
CPC ......... H03H 2210/00; H03H 2210/012; H03H 2210/025; H03H 2210/033; H03H 2210/036; H03H 9/02023; H03H 9/13; H03H 9/56; H03H 9/585
See application file for complete search history.

(56) References Cited

U.S. PATENT DOCUMENTS

| | | | |
|---|---|---|---|
| 6,242,843 B1 | 6/2001 | Pohjonen et al. | |
| 6,862,441 B2 | 3/2005 | Ella | |
| 7,161,434 B2 | 1/2007 | Rhodes | |
| 7,367,095 B2 | 5/2008 | Larson, III et al. | |
| 7,454,178 B2 | 11/2008 | Block et al. | |
| 7,656,228 B2 | 2/2010 | Fukuda et al. | |
| 7,659,796 B2 | 2/2010 | Funami et al. | |
| 7,692,270 B2 | 4/2010 | Subramanyam et al. | |
| 7,804,374 B1 | 9/2010 | Brown et al. | |
| 8,269,577 B2 | 9/2012 | Inoue et al. | |
| 8,576,024 B2 | 11/2013 | Erb et al. | |
| 9,041,484 B2 | 5/2015 | Burgener et al. | |
| 9,190,979 B2 | 11/2015 | Granger-Jones et al. | |
| 9,255,912 B2 | 2/2016 | Johnston et al. | |
| 9,281,800 B2 | 3/2016 | Tsuzuki | |
| 9,438,202 B2 | 9/2016 | Reinhardt et al. | |
| 9,705,473 B2 | 7/2017 | David et al. | |
| 9,819,327 B2 | 11/2017 | Maruthamuthu et al. | |
| 9,847,769 B2 * | 12/2017 | Khlat | H03H 9/605 |
| 10,009,010 B2 | 6/2018 | Kando et al. | |
| 10,243,537 B2 | 3/2019 | Khlat | |
| 10,476,481 B2 | 11/2019 | Chen et al. | |
| 10,985,731 B2 | 4/2021 | Khlat | |
| 11,050,412 B2 | 6/2021 | Khlat et al. | |
| 11,095,268 B2 | 8/2021 | Schmidhammer | |
| 11,165,412 B2 | 11/2021 | Khlat et al. | |
| 11,165,413 B2 | 11/2021 | Khlat et al. | |
| 11,742,818 B2 | 8/2023 | Khlat | |
| 2002/0158717 A1 | 10/2002 | Toncich | |
| 2002/0163400 A1 | 11/2002 | Toncich | |
| 2003/0227338 A1 | 12/2003 | Kawakubo et al. | |
| 2006/0098723 A1 | 5/2006 | Toncich et al. | |
| 2007/0107519 A1 | 5/2007 | Liu et al. | |
| 2007/0131032 A1 | 6/2007 | Liu | |
| 2007/0296513 A1 | 12/2007 | Ruile et al. | |
| 2008/0065290 A1 | 3/2008 | Breed et al. | |
| 2008/0129416 A1 | 6/2008 | Volatier et al. | |
| 2009/0289526 A1 | 11/2009 | Sinha et al. | |
| 2009/0315643 A1 | 12/2009 | Yamakawa et al. | |
| 2010/0308933 A1 | 12/2010 | See et al. | |
| 2012/0212304 A1 | 8/2012 | Zhang et al. | |
| 2012/0313731 A1 | 12/2012 | Burgener et al. | |
| 2014/0070905 A1 | 3/2014 | Raieszadeh et al. | |
| 2015/0163044 A1 | 6/2015 | Analui et al. | |
| 2016/0191012 A1 | 6/2016 | Khlat et al. | |
| 2017/0040948 A1 | 2/2017 | Levesque | |
| 2017/0048859 A1 | 2/2017 | Hayakawa | |
| 2017/0093370 A1 | 3/2017 | Khlat et al. | |
| 2017/0214389 A1 | 7/2017 | Tsutsumi | |
| 2017/0230066 A1 | 8/2017 | Little et al. | |
| 2017/0244382 A1 | 8/2017 | Lear | |
| 2017/0264268 A1 | 9/2017 | Schmidhammer | |
| 2018/0076793 A1 | 3/2018 | Khlat et al. | |
| 2018/0123562 A1 | 5/2018 | Bradley | |
| 2018/0159562 A1 | 6/2018 | Bauder | |
| 2018/0234078 A1 * | 8/2018 | Wada | H03H 9/6403 |
| 2019/0081613 A1 | 3/2019 | Nosaka | |
| 2019/0260355 A1 | 8/2019 | Khlat | |
| 2019/0393860 A1 | 12/2019 | Shih et al. | |
| 2020/0028491 A1 | 1/2020 | Kuroyanagi | |
| 2020/0076366 A1 | 3/2020 | Bahr et al. | |
| 2020/0099360 A1 * | 3/2020 | Khlat | H03H 9/02125 |
| 2020/0099363 A1 * | 3/2020 | Khlat | H03H 9/205 |
| 2020/0099364 A1 * | 3/2020 | Khlat | H03H 9/02023 |
| 2020/0274519 A1 | 8/2020 | Gamble et al. | |
| 2021/0194459 A1 | 6/2021 | Alavi et al. | |
| 2021/0399750 A1 | 12/2021 | Varela Campelo | |
| 2023/0093885 A1 | 3/2023 | Ella et al. | |
| 2023/0134889 A1 | 5/2023 | Costa | |
| 2023/0223920 A1 | 7/2023 | Koohi et al. | |
| 2023/0223922 A1 | 7/2023 | Koohi et al. | |
| 2023/0223926 A1 | 7/2023 | Koohi et al. | |
| 2023/0299746 A1 | 9/2023 | Levesque | |
| 2024/0053193 A1 | 2/2024 | Khlat | |
| 2024/0097650 A1 | 3/2024 | Khlat et al. | |
| 2024/0213956 A1 | 6/2024 | Khlat et al. | |
| 2024/0258992 A1 | 8/2024 | Khlat | |
| 2024/0333257 A1 | 10/2024 | Khlat | |
| 2024/0333259 A1 | 10/2024 | Khlat | |
| 2024/0364309 A1 | 10/2024 | Khlat | |
| 2024/0413809 A1 | 12/2024 | Khlat | |

FOREIGN PATENT DOCUMENTS

| | | |
|---|---|---|
| JP | 2009130831 A | 6/2009 |
| JP | 2022548348 A | 11/2022 |

OTHER PUBLICATIONS

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

* cited by examiner

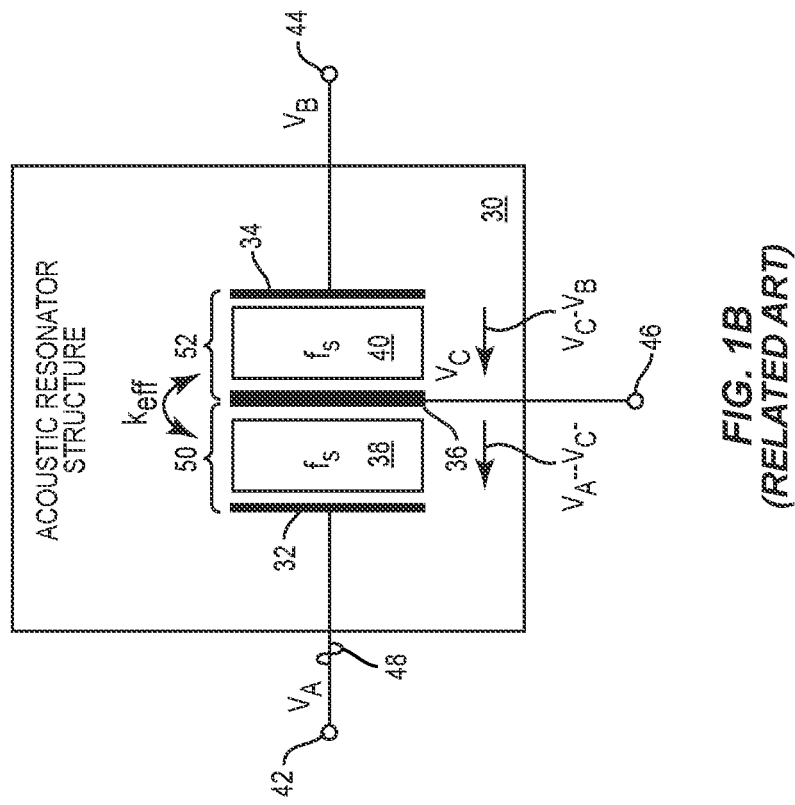
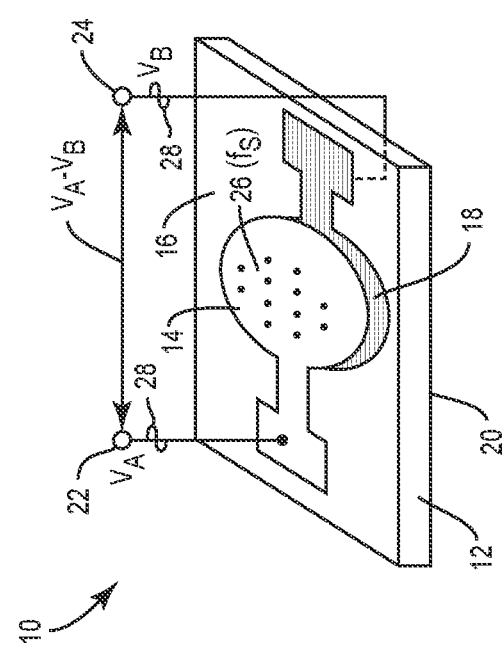
FIG. 1A (RELATED ART)
FIG. 1B (RELATED ART)

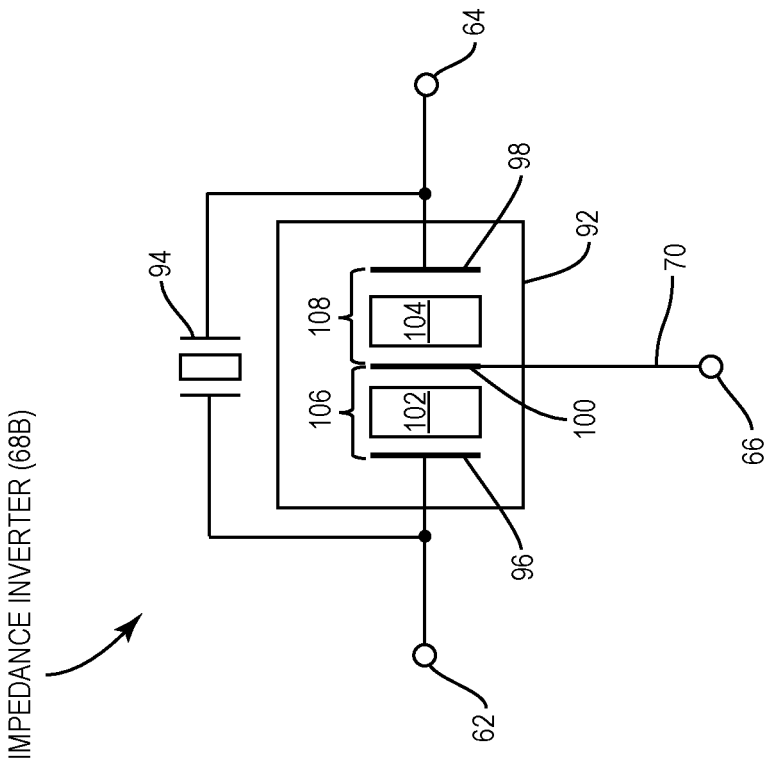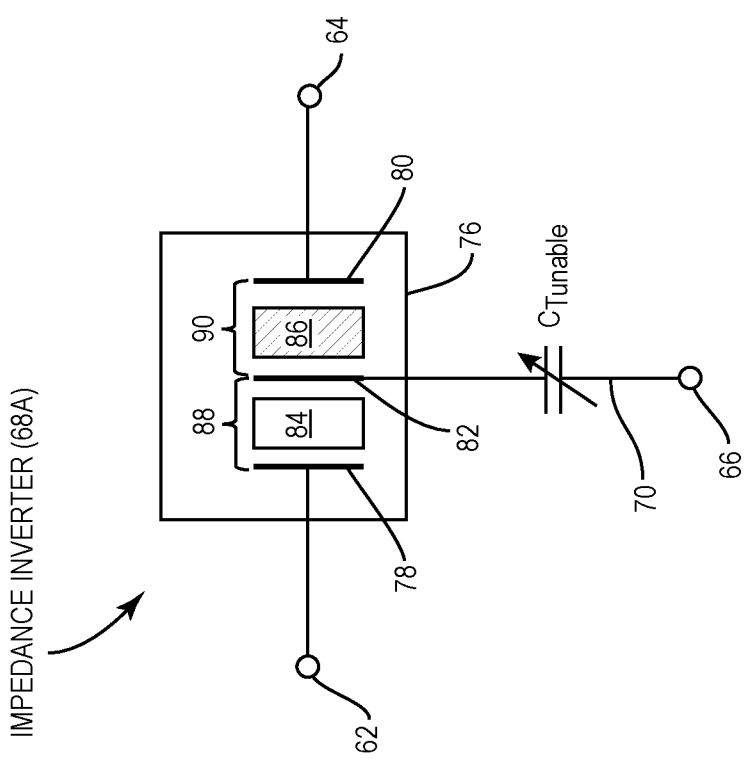
FIG. 3A
FIG. 3B

MULTI-PASSBAND FREQUENCY ACOUSTIC STRUCTURE

RELATED APPLICATIONS

This application claims the benefits of U.S. provisional patent application Ser. No. 63/358,945, filed on Jul. 7, 2022, and U.S. provisional patent application Ser. No. 63/415,000, filed on Oct. 11, 2022, the disclosures of which are hereby incorporated herein by reference in their entireties.

FIELD OF THE DISCLOSURE

The technology of the disclosure relates generally to an acoustic resonator(s)/filter(s).

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as surface acoustic wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filters of choice for Fifth Generation (5G) and 5G new radio (5G-NR) wireless devices. While these demands keep raising the complexity of wireless devices, there is a constant need to improve the performance of acoustic resonators and filters that are based thereon.

SUMMARY

Aspects disclosed in the detailed description include a multi-passband frequency acoustic structure. The multi-passband frequency acoustic structure includes an acoustic resonator structure configured to pass a signal to a signal output in a built-in series resonance frequency (a.k.a. built-in passband frequency). Notably, the built-in serial resonance frequency is typically fixed and determined by the mass and/or structure of the acoustic resonator structure. In embodiments disclosed herein, the multi-passband frequency acoustic structure further includes a tuning circuit, which can be tuned to bypass the acoustic resonator structure in a tunable serial resonance frequency (a.k.a. tunable passband frequency) to pass the signal directly to the signal output, or to forward the signal to the acoustic resonator structure outside the tunable serial resonance frequency (e.g., in the built-in serial resonance frequency). As such, the multi-passband frequency acoustic structure can operate with multiple serial resonance frequencies to thereby support multiple passband frequencies.

In one aspect, a multi-passband frequency acoustic structure is provided. The multi-passband frequency acoustic structure includes an acoustic resonator structure. The acoustic resonator structure is coupled to a signal output and is configured to resonate at a built-in serial resonance frequency to pass a signal to the signal output. The acoustic structure also includes a tuning circuit. The tuning circuit is coupled to a signal input, the acoustic resonator structure, and directly to the signal output. The tuning circuit is configured to receive the signal via the signal input, resonate at a tunable serial resonance frequency different from the built-in serial resonance frequency to pass the signal directly from the signal input to the signal output. The tuning circuit is also configured to forward the signal to the acoustic resonator structure outside the tunable serial resonance frequency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 1A is a schematic diagram of an exemplary bulk acoustic wave (BAW) resonator;

FIG. 1B is a schematic diagram of an exemplary acoustic resonator structure that may be constructed based on the BAW resonator of FIG. 1A;

FIGS. 3A-3I are schematic diagrams of an exemplary impedance inverter, which can be configured according to various embodiments of the present disclosure to provide a tunable serial resonance frequency in the tuning circuit in FIG. 2.

DETAILED DESCRIPTION

Figure 2:
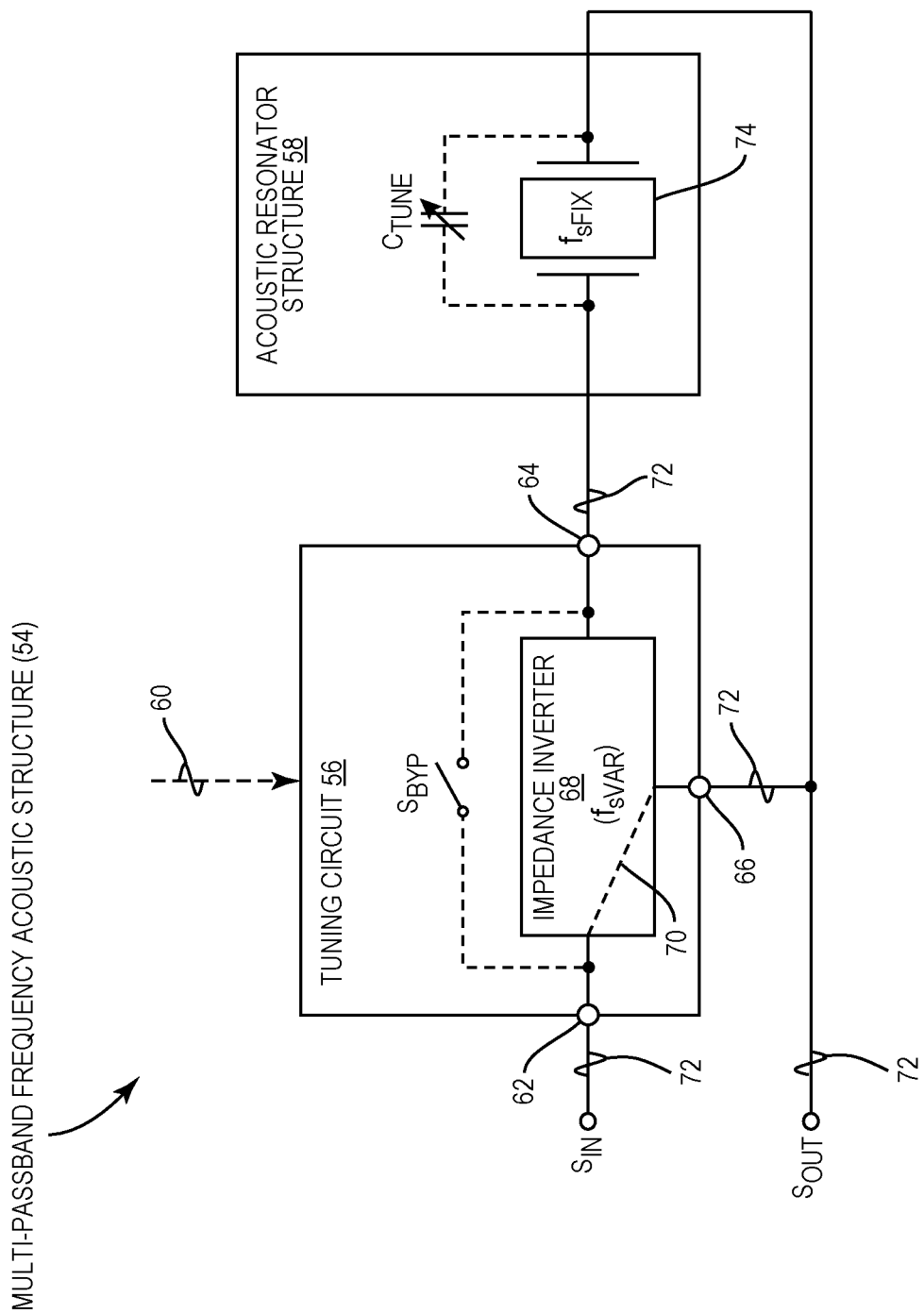
FIG. 2 is a schematic diagram of an exemplary multi-passband frequency acoustic structure wherein a tuning circuit and an acoustic resonator structure can be configured according to embodiments of the present disclosure to support multiple-passband frequencies.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-passband frequency acoustic structure. The multi-passband frequency acoustic structure includes an acoustic resonator structure configured to pass a signal to a signal output in a built-in series resonance frequency (a.k.a. built-in passband frequency). Notably, the built-in serial resonance frequency is typically fixed and determined by the mass and/or structure of the acoustic resonator structure. In embodiments disclosed herein, the multi-passband frequency acoustic structure further includes a tuning circuit, which can be tuned to bypass the acoustic resonator structure in a tunable serial resonance frequency (a.k.a. tunable passband frequency) to pass the signal directly to the signal output, or to forward the signal to the acoustic resonator structure outside the tunable serial resonance frequency (e.g., in the built-in serial resonance frequency). As such, the multi-passband frequency acoustic structure can operate with multiple serial resonance frequencies to thereby support multiple passband frequencies.

Before discussing the multi-passband frequency acoustic structure of the present disclosure, starting at FIG. 2, a brief discussion of a bulk acoustic wave (BAW) acoustic resonator and an acoustic resonator structure incorporating a pair of BAW acoustic resonators is first provided with reference to FIGS. 1A and 1B, respectively, to help understand some key characteristics of the acoustic resonator structure.

FIG. 1A is a schematic diagram of an exemplary BAW resonator 10. The BAW resonator 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a first voltage $V_A$ and a second voltage $V_B$ are applied to a top electrical port 22 and a bottom electrical port 24, respectively, the BAW resonator 10 resonates in a series resonance frequency ($f_S$) to cause an acoustic wave 26 between the top surface 16 and the bottom surface 20 of the piezo layer 12. The series resonance frequency ($f_S$) may be determined by a thickness of the piezo layer 12 as well as a mass of the top metal electrode 14 and the bottom metal electrode 18. As a result, the BAW resonator 10 can pass a signal 28 from the top electrical port 22 to the bottom electrical port 24, thus making the BAW resonator 10 able to function as a signal filter in the series resonance frequency.

FIG. 1B is a schematic diagram of an exemplary acoustic resonator structure 30 that may be constructed based on the BAW resonator 10 of FIG. 1A. The acoustic resonator structure 30 includes a first electrode 32, a second electrode 34, and a third electrode 36. The third electrode 36 is provided in between the first electrode 32 and the second electrode 34. The acoustic resonator structure 30 includes a first piezo layer 38 provided between the first electrode 32 and the third electrode 36. The acoustic resonator structure 30 also includes a second piezo layer 40 provided between the third electrode 36 and the second electrode 34. In a non-limiting example, the first piezo layer 38 and the second piezo layer 40 can be formed by quartz crystal. The thickness of the first piezo layer 38 and the second piezo layer 40 and/or the mass of the first electrode 32, the second electrode 34, and the third electrode 36 are factors that determine a series resonance frequency ($f_S$) of the acoustic resonator structure 30.

The first electrode 32, the second electrode 34, and the third electrode 36 may be coupled to an input node 42, an output node 44, and a common node 46, respectively. When a first voltage $V_A$ is applied between the input node 42 and the common node 46 concurrent to a second voltage $V_B$ being applied between the output node 44 and the common node 46, the acoustic resonator structure 30 resonates in the series resonance frequency ($f_S$) to pass a signal 48 from the input node 42 to the output node 44. In this regard, the acoustic resonator structure 30 functions as a bandpass filter in the series resonance frequency ($f_S$). As such, the series resonance frequency ($f_S$) can also be referred to as a passband frequency.

In contrast, the acoustic resonator structure 30 can cause a series capacitance ($C_O$) between the input node 42 and the output node 44 to block the signal 48 in a parallel resonance frequency ($f_P$) that is different from the series resonance frequency ($f_S$). In this regard, the acoustic resonator structure 30 functions as a stopband filter in the parallel resonance frequency ($f_P$). Accordingly, the parallel resonance frequency ($f_P$) can also be referred to as a stopband frequency.

The first electrode 32, the first piezo layer 38, and the third electrode 36 may be seen as collectively forming a first BAW resonator 50. Likewise, the third electrode 36, the second piezo layer 40, and the second electrode 34 may be seen as collectively forming a second BAW resonator 52. In this regard, the acoustic resonator structure 30 may be seen as being formed by stacking the first BAW resonator 50 with the second BAW resonator 52. In this regard, the first BAW resonator 50 and the second BAW resonator 52 can be seen as being mutually coupled based on an effective coupling factor (ken), which can be determined based on equation (Eq. 1) below.

$$k_{eff}^2 = \frac{\pi f_S}{2 f_P} * \left[\tan^{-1} \frac{\pi f_S}{2 f_P}\right] \qquad \text{(Eq. 1)}$$

Both the first BAW resonator 50 and the second BAW resonator 52 are configured to resonate in the series resonance frequency ($f_S$) to pass the signal 48 from the input node 42 to the output node 44. In one non-limiting example, the first electrode 32, the first piezo layer 38, and the third electrode 36 can form a polarized BAW resonator (also referred to as a c-type structure). In this regard, the first piezo layer 38 expands in response to the first voltage $V_A$ being a positive voltage and compresses in response to the first voltage $V_A$ being a negative voltage. The third electrode 36, the second piezo layer 40, and the second electrode 34 can form a polarized-inverted BAW resonator (also referred to as an f-type structure). In this regard, the second piezo layer 40 expands in response to the second voltage $V_B$ being a negative voltage and compresses in response to the second voltage $V_B$ being a positive voltage. Accordingly, the acoustic resonator structure 30 outputs a third voltage $V_C$ (also referred to as a shunt voltage $V_C$) via the common node 46. The third voltage $V_C$ is related to the first voltage $V_A$ and the second voltage $V_B$ in accordance to equation (Eq. 2) below.

$$(V_A - V_C) = (V_C - V_B) \rightarrow V_C = (V_A + V_B)/2 \qquad \text{(Eq. 2)}$$

As mentioned earlier, the series resonance frequency ($f_S$) is primarily determined by such internal factors as thickness of the first piezo layer 38 and the second piezo layer 40 and/or the mass of the first electrode 32, the second electrode 34, and the third electrode 36. As such, the acoustic resonator structure 30 can only be used as a single-passband frequency filter as it is difficult to change the series resonance frequency ($f_S$) once the acoustic resonator structure 30 is formed. However, as discussed below, it is possible to turn the acoustic resonator structure 30 into a multi-passband frequency filter based on the embodiments of the present disclosure.

FIG. 2 is a schematic diagram of an exemplary multi-passband frequency acoustic structure 54 wherein a tuning circuit 56 and an acoustic resonator structure 58 can be configured according to embodiments of the present disclosure to support multiple passband frequencies. Herein, the acoustic resonator structure 58 is configured to resonate at a built-in serial resonance frequency $f_{sFIX}$ to support a built-in passband frequency. Like the BAW resonator 10 of FIG. 1A and the acoustic resonator structure 30 of FIG. 1B, the built-in serial resonance frequency $f_{sFIX}$ is typically fixed and determined by the mass and structure of the acoustic resonator structure 58. The tuning circuit 56, however, can be tuned (e.g., via a tuning signal 60) to resonate at a tunable serial resonance frequency $f_{sVAR}$, which is different from the built-in serial resonance frequency $f_{sFIX}$, to thereby provide a tunable passband frequency.

The multi-passband frequency acoustic structure 54 includes a signal input $S_{IN}$ and a signal output $S_{OUT}$. The tuning circuit 56 and the acoustic resonator structure 58 are coupled in series between the signal input $S_{IN}$ and the signal output $S_{OUT}$. Specifically, the tuning circuit 56 includes a first node 62 coupled to the signal input $S_{IN}$, a second node 64 coupled to the acoustic resonator structure 58, and a third node 66 coupled directly to the signal output $S_{OUT}$.

In this regard, the tuning circuit 56 is coupled to the signal input $S_{IN}$ via the first node 62 and to the signal output $S_{OUT}$ via the third node 66. The acoustic resonator structure 58, on the other hand, is coupled to the signal input $S_{IN}$ via the tuning circuit 56 and to the signal output $S_{OUT}$ directly.

According to an embodiment of the present disclosure, the tuning circuit 56 includes an impedance inverter 68 that is coupled to the first node 62, the second node 64, and the third node 66. The tuning circuit 56 may also include a bypass switch $S_{BYP}$ that is coupled in parallel to the impedance inverter 68 between the first node 62 and the second node 64. Herein, the bypass switch $S_{BYP}$ may be opened or closed either by the tuning signal 60 or by a separate control signal (not shown).

Specifically, the impedance inverter 68 can be tuned, either statically or dynamically, to resonate at the tunable serial frequency $f_{sVAR}$ to thereby provide a direct signal path 70 between the first node 62 and the third node 66. As such, a signal 72 received via the signal input $S_{IN}$ can be directly passed to the signal output $S_{OUT}$, bypassing the acoustic resonator structure 58.

When the signal 72 falls outside the tunable serial resonance frequency $f_{sVAR}$, the bypass switch $S_{BYP}$ may be closed to forward the signal 72 from the signal input $S_{IN}$ to the acoustic resonator structure 58, bypassing the impedance inverter 68. The acoustic resonator structure 58 includes an acoustic resonator 74, which may be identical or functionally equivalent to the BAW resonator 10 of FIG. 1A and the acoustic resonator structure 30 of FIG. 1B. As such, the acoustic resonator 74 can pass the signal 72 to the signal output $S_{OUT}$ if the signal 72 falls within the built-in serial resonance frequency $f_{sFIX}$ of the acoustic resonator 74. In case the signal 72 also falls outside the built-in serial resonance frequency $f_{sFIX}$ (e.g., falls in the parallel resonance frequency of the acoustic resonator 74) the acoustic resonator 74 will function as a stopband filter to block the signal 72 from the signal output $S_{OUT}$. In an embodiment, the acoustic resonator structure 58 may include a tunable capacitor $C_{TUNE}$ coupled in parallel to the acoustic resonator 74. The tunable capacitor $C_{TUNE}$ may be tuned to adjust the parallel resonance frequency of the acoustic resonator structure 58.

The impedance inverter 68 can be configured to resonate at the tunable serial resonance frequency $f_{sVAR}$ based on multiple embodiments, as described next in FIGS. 3A-3I. Common elements between FIGS. 2 and 3A-3I are shown therein with common element numbers and will not be re-described herein.

FIG. 3A is a schematic diagram of an exemplary impedance inverter 68A configured according to one embodiment of the present disclosure and can be provided in the multi-passband frequency acoustic structure 54 as the impedance inverter 68. The impedance inverter 68A includes an acoustic resonator 76 and a tunable capacitor $C_{Tunable}$.

The acoustic resonator 76 includes a first electrode 78, a second electrode 80, and a third electrode 82 (a.k.a. "coupling electrode"), which is provided in between the first electrode 78 and the second electrode 80. The tunable capacitor $C_{Tunable}$ is coupled between the third electrode 82 and the third node 66.

The acoustic resonator 76 also includes a first piezo layer 84 and a second piezo layer 86. The first electrode 78, the first piezo layer 84, and the third electrode 82 collectively form a polarized resonator 88 (a.k.a. c-type resonator), while the third electrode 82, the second piezo layer 86, and the second electrode 80 collectively form a polarized-inverted resonator 90 (a.k.a. f-type resonator). The polarized resonator 88 and the polarized-inverted resonator are each tuned to resonate at the tunable serial resonance frequency $f_{sVAR}$. The tunable capacitor $C_{Tunable}$ is also tuned to provide the signal path 70 (e.g., a short circuit) at the tunable serial resonance frequency $f_{sVAR}$.

FIG. 3B is a schematic diagram of an exemplary impedance inverter 68B configured according to another embodiment of the present disclosure and can be provided in the multi-passband frequency acoustic structure 54 as the impedance inverter 68. The impedance inverter 68B includes an acoustic resonator 92 and a parallel resonator 94, which is coupled in parallel to the acoustic resonator 92 between the first node 62 and the second node 64.

The acoustic resonator 92 includes a first electrode 96, a second electrode 98, and a third electrode 100 (a.k.a. "coupling electrode"), which is provided in between the first electrode 96 and the second electrode 98. The acoustic resonator 92 also includes a first piezo layer 102 and a second piezo layer 104. The first electrode 96, the first piezo layer 102, and the third electrode 100 collectively form a first polarized resonator 106 (a.k.a. c-type resonator), while the third electrode 100, the second piezo layer 104, and the second electrode 98 collectively form a second polarized resonator 108 (a.k.a. c-type resonator). The pair of the first polarized resonator 106 and the second polarized resonator 108 are each tuned to resonate at the tunable serial resonance frequency $f_{sVAR}$.

Figure 3D:
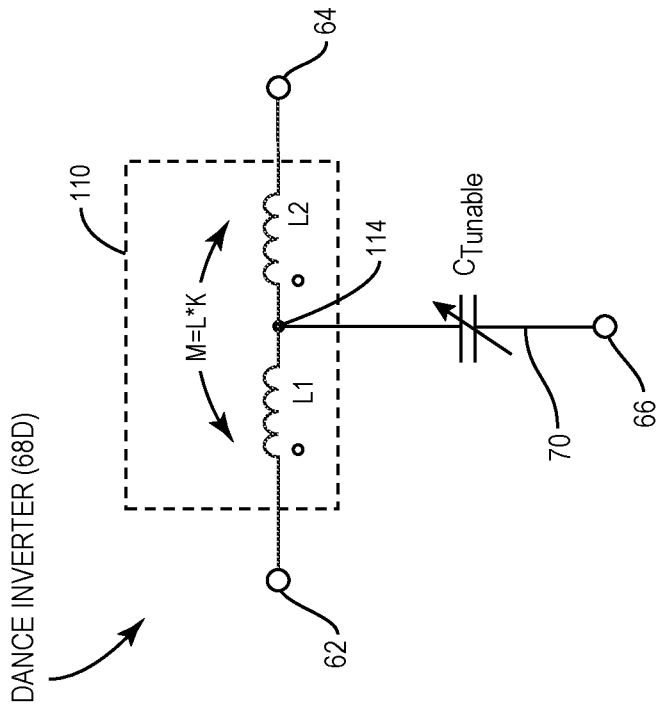
Figure 3C:
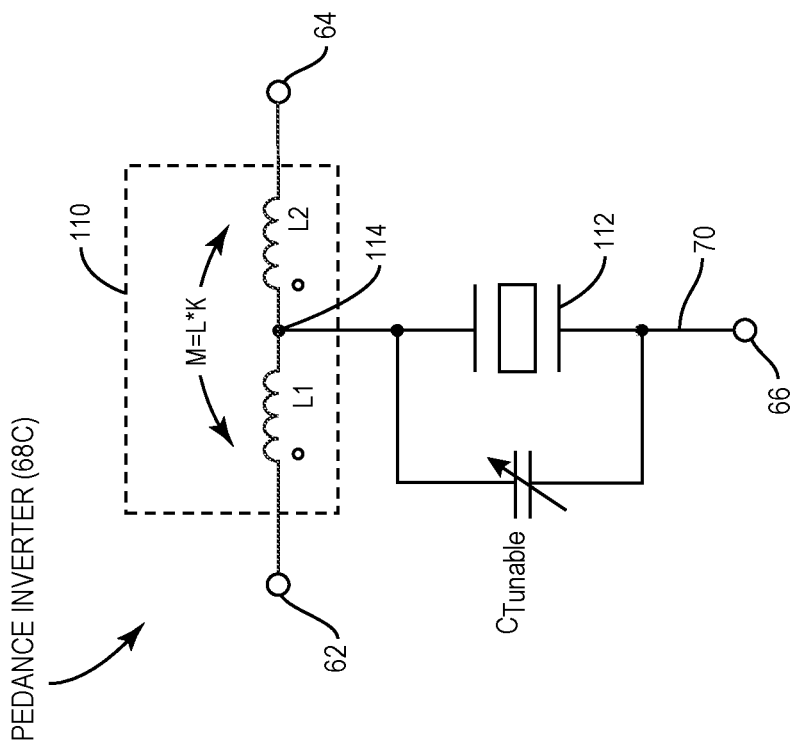

FIG. 3C is a schematic diagram of an exemplary impedance inverter 68C configured according to another embodiment of the present disclosure and can be provided in the multi-passband frequency acoustic structure 54 as the impedance inverter 68. The impedance inverter 68C includes a transformer 110 that is made of a pair of negatively coupled inductors L1, L2 each having a respective inductance L. Herein, the negatively coupled inductors L1, L2 are couped in series between the first node 62 and the second node 64 and tuned to each resonate at the tunable serial resonance frequency $f_{sVAR}$.

The impedance inverter 68C also includes a parallel resonator 112 and a tunable capacitor $C_{Tunable}$. Herein, the parallel resonator 112 and the tunable capacitor $C_{Tunable}$ are coupled in parallel between a middle node 114 and the third node 66. As illustrated, the middle node 114 is located between the pair of negatively coupled inductors L1, L2. Notably, by coupling the parallel resonator 112 in parallel with the tunable capacitor $C_{Tunable}$, it is possible to improve a quality factor (a.k.a. Q-factor) of the impedance inverter 68C.

FIG. 3D is a schematic diagram of an exemplary impedance inverter 68D configured according to another embodiment of the present disclosure and can be provided in the multi-passband frequency acoustic structure 54 as the impedance inverter 68. The impedance inverter 68D is substantially similar to the impedance inverter 68C of FIG. 3C, except that the impedance inverter 68D does not include the parallel resonator 112. As a result, the impedance inverter 68D may be a low-cost impedance inverter with a relatively lower Q-factor compared to the impedance inverter 68C.

Figure 3F:
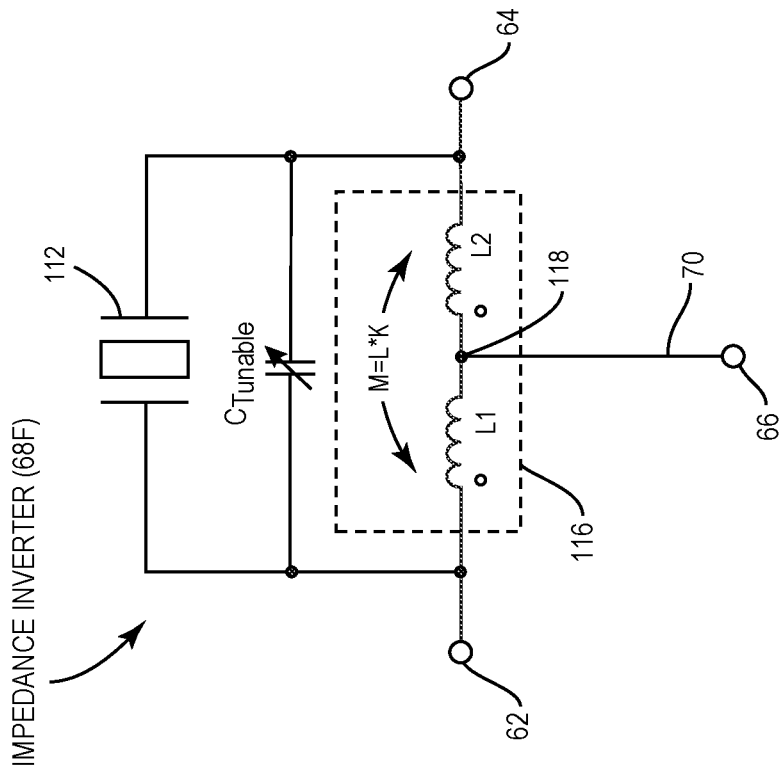
Figure 3E:
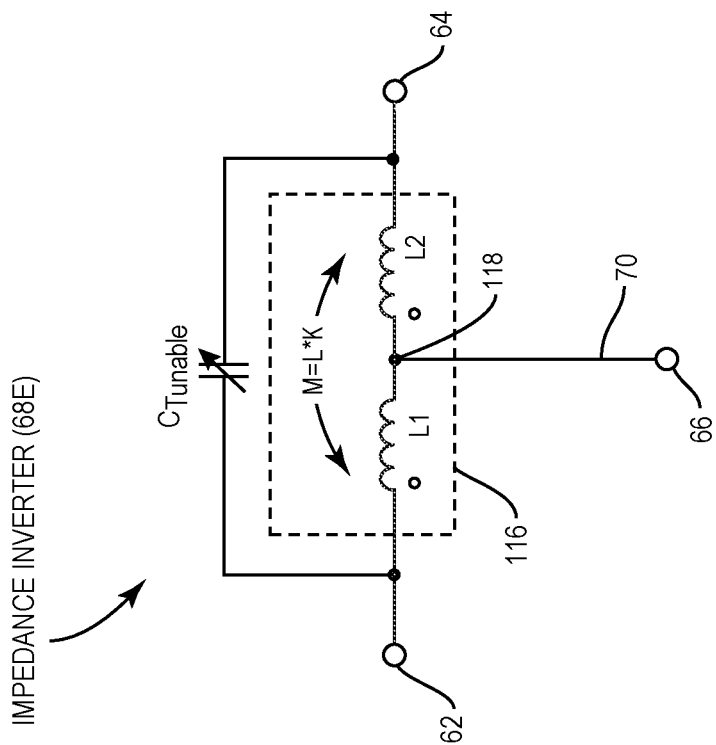

FIG. 3E is a schematic diagram of an exemplary impedance inverter 68E configured according to another embodiment of the present disclosure and can be provided in the multi-passband frequency acoustic structure 54 as the impedance inverter 68. The impedance inverter 68E includes a transformer 116 that is made of a pair of positively coupled inductors L1, L2 each having a respective inductance L. Herein, the positively coupled inductors L1, L2 are couped in series between the first node 62 and the second node 64 and tuned to each resonate at the tunable serial resonance frequency $f_{sVAR}$. The impedance inverter 68E also includes a tunable capacitor $C_{Tunable}$ that is coupled in parallel to the transformer 116 between the first node 62 and the second node 64. The third node 66 is coupled to a middle node 118, which is located in between the pair of positively coupled inductors L1, L2.

FIG. 3F is a schematic diagram of an exemplary impedance inverter 68F configured according to another embodiment of the present disclosure and can be provided in the multi-passband frequency acoustic structure 54 as the impedance inverter 68. The impedance inverter 68F further includes the parallel resonator 112, which is coupled in parallel to the transformer 116 and the tunable capacitor $C_{Tunable}$ between the first node 62 and the second node 64. By coupling the parallel resonator 112 in parallel with the transformer 116 and the tunable capacitor $C_{Tunable}$, the impedance inverter 68F can achieve an improved Q-factor compared to the impedance inverter 68E of FIG. 3E.

Figures 3G, 3H:
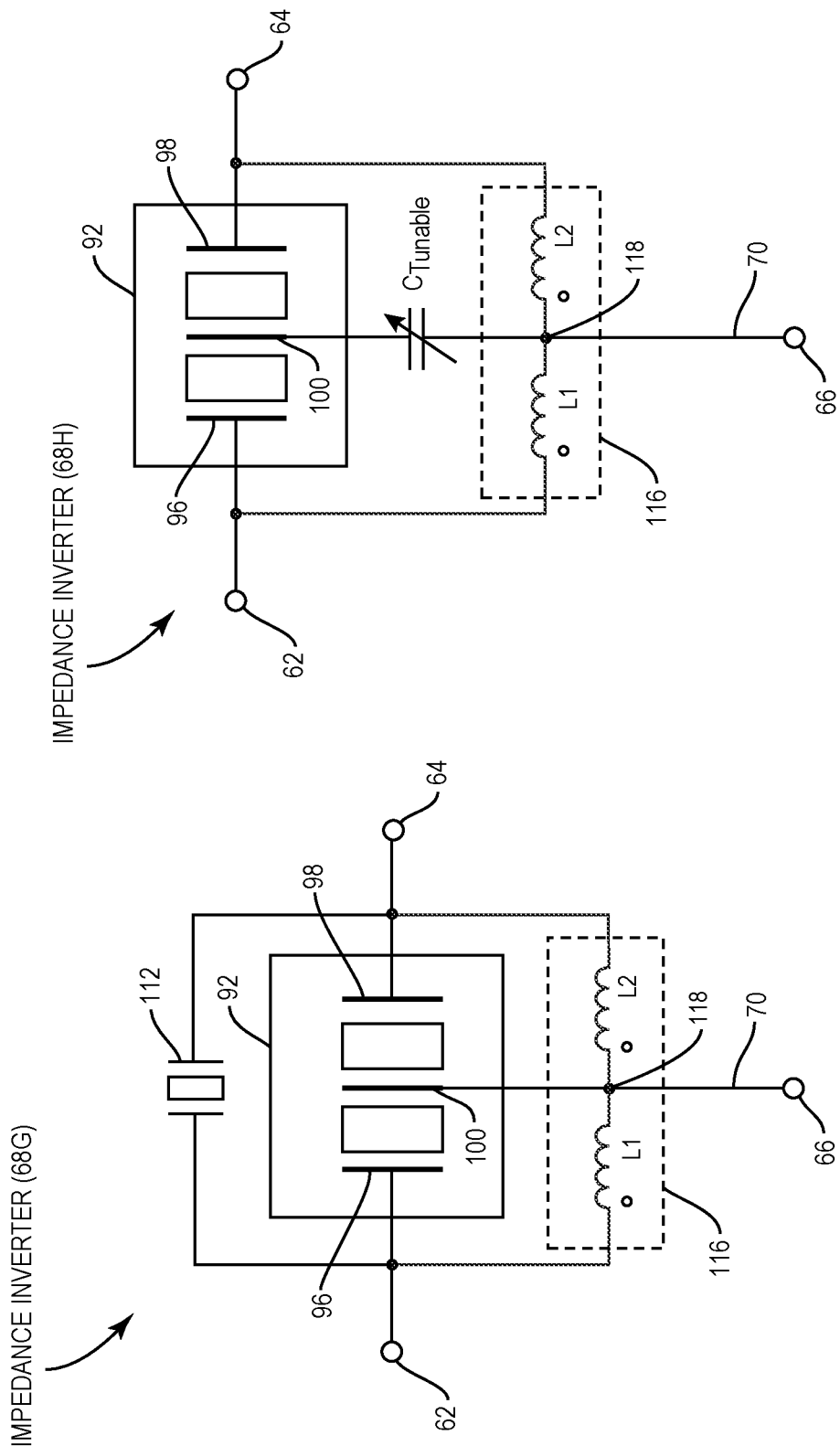

FIG. 3G is a schematic diagram of an exemplary impedance inverter 68G configured according to another embodiment of the present disclosure and can be provided in the multi-passband frequency acoustic structure 54 as the impedance inverter 68. Herein, the impedance inverter 68G includes the acoustic resonator 92, the parallel resonator 112, and the transformer 116 that are coupled in parallel between the first node 62 and the second node 64. The third node 66 is coupled to the middle node 118 and the third electrode 100.

FIG. 3H is a schematic diagram of an exemplary impedance inverter 68H configured according to another embodiment of the present disclosure and can be provided in the multi-passband frequency acoustic structure 54 as the impedance inverter 68. Herein, the impedance inverter 68H includes the acoustic resonator 92 and the transformer 116 that are coupled in parallel between the first node 62 and the second node 64. The impedance inverter 68H also includes the tunable capacitor $C_{Tunable}$, which is coupled between the third electrode 100 and the middle node 118.

Figure 3I:
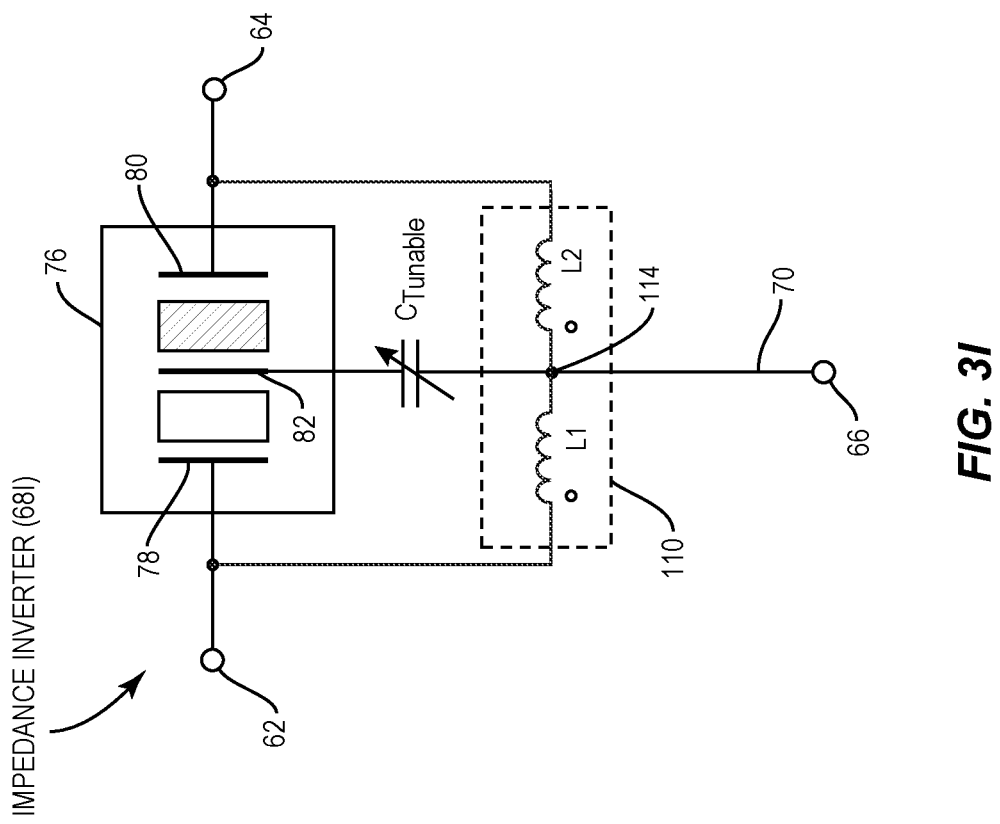

FIG. 3I is a schematic diagram of an exemplary impedance inverter 68I configured according to another embodiment of the present disclosure and can be provided in the multi-passband frequency acoustic structure 54 as the impedance inverter 68. Herein, the impedance inverter 68I includes the acoustic resonator 76 and the transformer 110 that are coupled in parallel between the first node 62 and the second node 64. The impedance inverter 68H also includes the tunable capacitor $C_{Tunable}$, which is coupled between the third electrode 82 and the middle node 114.

Figure 4:
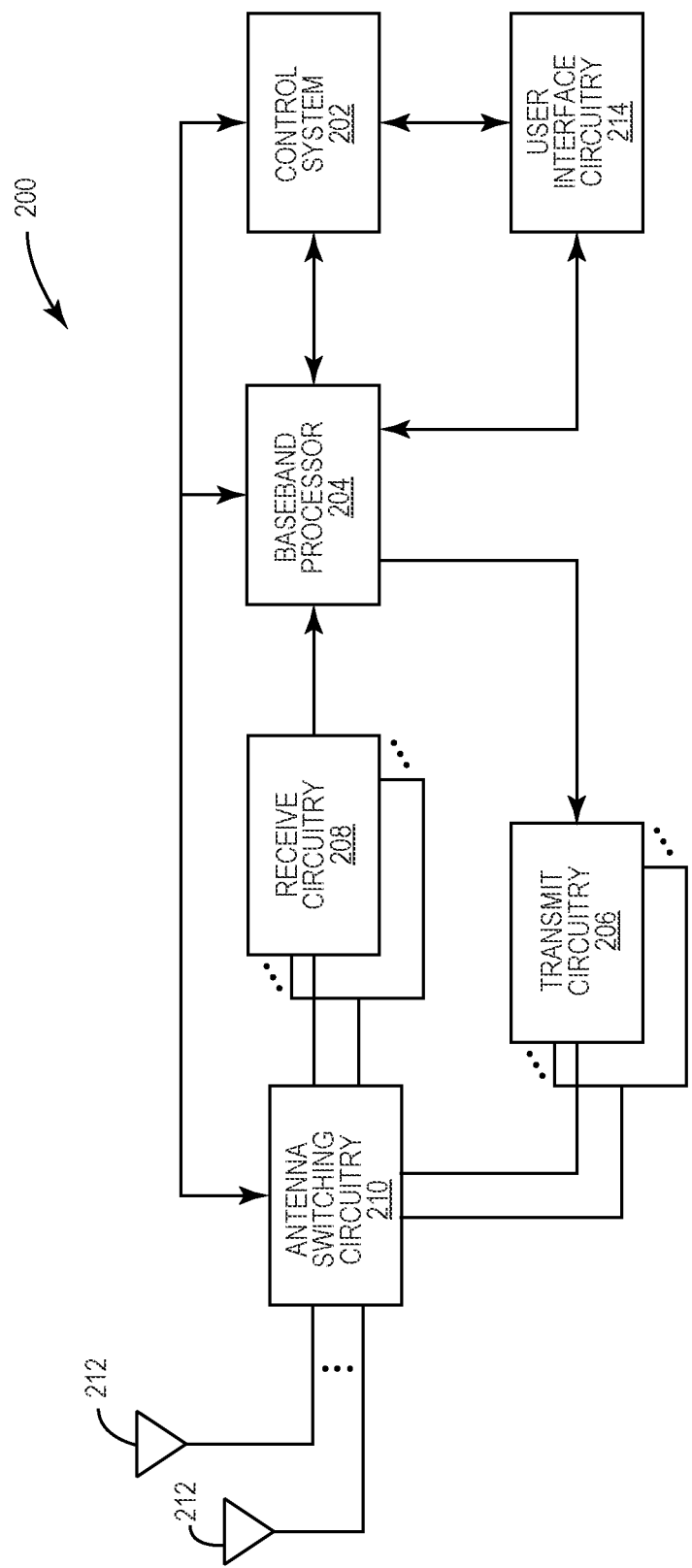
FIG. 4 is a schematic diagram of an exemplary user element wherein the multi-passband frequency acoustic structure of FIG. 2 can be provided.

The multi-passband frequency acoustic structure 54 of FIG. 2 can be provided in a user element to selectively pass the signal 72 in one or more of the built-in serial resonance frequency $f_{sFIX}$ and the tunable serial resonance frequency $f_{sVAR}$. FIG. 4 is a schematic diagram of an exemplary user element 200 wherein the multi-passband frequency acoustic structure 54 of FIG. 2 can be provided.

Herein, the user element 200 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 200 will generally include a control system 202, a baseband processor 204, transmit circuitry 206, receive circuitry 208, antenna switching circuitry 210, multiple antennas 212, and user interface circuitry 214. In a non-limiting example, the control system 202 can be a field-programmable gate array (FPGA), as an example. In this regard, the control system 202 can include at least a microprocessor(s), an embedded memory circuit(s), and a communication bus interface(s). The receive circuitry 208 receives radio frequency signals via the antennas 212 and through the antenna switching circuitry 210 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 204 processes the digitized received signal to extract the information or data bits conveyed in the received signal. This processing typically comprises demodulation, decoding, and error correction operations, as will be discussed on greater detail below. The baseband processor 204 is generally implemented in one or more digital signal processors (DSPs) and application specific integrated circuits (ASICs).

For transmission, the baseband processor 204 receives digitized data, which may represent voice, data, or control information, from the control system 202, which it encodes for transmission. The encoded data is output to the transmit circuitry 206, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 212 through the antenna switching circuitry 210. The multiple antennas 212 and the replicated transmit and receive circuitries 206, 208 may provide spatial diversity. Modulation and processing details will be understood by those skilled in the art.

Those skilled in the art will recognize improvements and modifications to the embodiments of the present disclosure. All such improvements and modifications are considered within the scope of the concepts disclosed herein and the claims that follow.

What is claimed is:

1. A multi-passband frequency acoustic structure comprising:
   an acoustic resonator structure coupled to a signal output and configured to resonate at a built-in serial resonance frequency to pass a signal to the signal output; and
   a tuning circuit coupled to a signal input, the acoustic resonator structure, and directly to the signal output, the tuning circuit is configured to:
      receive the signal via the signal input;
      resonate at a tunable serial resonance frequency different from the built-in serial resonance frequency to pass the signal directly from the signal input to the signal output and bypass the acoustic resonator structure; and
      forward the signal to the acoustic resonator structure outside the tunable serial resonance frequency.

2. The multi-passband frequency acoustic structure of claim 1, wherein the tuning circuit comprises:
   a first node coupled to the signal input;
   a second node coupled to the acoustic resonator structure;
   a third node coupled directly to the signal output; and
   an impedance inverter coupled to the first node, the second node, and the third node.

3. The multi-passband frequency acoustic structure of claim 2, wherein the impedance inverter is configured to:
   pass the signal directly from the first node to the third node at the tunable serial resonance frequency; and
   block the signal between the first node, the second node, and the third node outside the tunable serial resonance frequency.

4. The multi-passband frequency acoustic structure of claim 3, wherein the tuning circuit further comprises a bypass switch coupled in parallel to the impedance inverter between the first node and the second node, the bypass switch is closed outside the tunable serial resonance frequency to forward the signal directly from the first node to the second node.

5. The multi-passband frequency acoustic structure of claim 2, wherein the impedance inverter comprises:
   an acoustic resonator comprising:
      a polarized resonator formed between a first electrode coupled to the first node and a coupling electrode; and
      a polarized-inverted resonator formed between the coupling electrode and a second electrode coupled to the second node; and
   a tunable capacitor coupled between the coupling electrode and the third node.

6. The multi-passband frequency acoustic structure of claim 5, wherein:
   the polarized resonator and the polarized-inverted resonator are each formed to resonate at the tunable serial resonance frequency; and
   the tunable capacitor is tuned to provide a direct signal path between the first node and the third node at the tunable serial resonance frequency.

7. A wireless device comprising a multi-passband frequency acoustic structure, the multi-passband frequency acoustic structure comprises:
   an acoustic resonator structure coupled to a signal output and configured to resonate at a built-in serial resonance frequency to pass a signal to the signal output; and
   a tuning circuit coupled to a signal input, the acoustic resonator structure, and directly to the signal output, the tuning circuit is configured to:
      receive the signal via the signal input;
      resonate at a tunable serial resonance frequency different from the built-in serial resonance frequency to pass the signal directly from the signal input to the signal output and bypass the acoustic resonator structure; and
      forward the signal to the acoustic resonator structure outside the tunable serial resonance frequency.

8. The wireless device of claim 7, wherein the tuning circuit comprises:
   a first node coupled to the signal input;
   a second node coupled to the acoustic resonator structure;
   a third node coupled directly to the signal output; and an impedance inverter coupled to the first node, the second node, and the third node.

9. The wireless device of claim 8, wherein the impedance inverter is configured to:
pass the signal directly from the first node to the third node at the tunable serial resonance frequency; and
block the signal between the first node, the second node, and the third node outside the tunable serial resonance frequency.

10. The wireless device of claim 9, wherein the tuning circuit further comprises a bypass switch coupled in parallel to the impedance inverter between the first node and the second node, the bypass switch is closed outside the tunable serial resonance frequency to forward the signal directly from the first node to the second node.

11. The wireless device of claim 8, wherein the impedance inverter comprises:
an acoustic resonator comprising:
a polarized resonator formed between a first electrode coupled to the first node and a coupling electrode; and
a polarized-inverted resonator formed between the coupling electrode and a second electrode coupled to the second node; and
a tunable capacitor coupled between the coupling electrode and the third node.

12. The wireless device of claim 11, wherein:
the polarized resonator and the polarized-inverted resonator are each formed to resonate at the tunable serial resonance frequency; and
the tunable capacitor is tuned to provide a direct signal path between the first node and the third node at the tunable serial resonance frequency.

\* \* \* \* \*